(12) United States Patent
Okamoto

(10) Patent No.: US 8,647,912 B2
(45) Date of Patent: Feb. 11, 2014

(54) SOLAR CELL AND METHOD FOR MANUFACTURING SOLAR CELL

(75) Inventor: Shingo Okamoto, Toyonaka (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 0 days.

(21) Appl. No.: 13/561,200

(22) Filed: Jul. 30, 2012

(65) Prior Publication Data
US 2012/0285525 A1 Nov. 15, 2012

Related U.S. Application Data

(63) Continuation of application No. PCT/JP2011/058270, filed on Mar. 31, 2011.

(30) Foreign Application Priority Data

Mar. 31, 2010 (JP) ................................ 2010-083217

(51) Int. Cl.
*H01L 21/00* (2006.01)
*H01L 27/14* (2006.01)
*H01L 31/00* (2006.01)
*H01L 21/20* (2006.01)

(52) U.S. Cl.
USPC ............ 438/57; 257/414; 257/428; 257/431; 136/255; 438/96; 438/478

(58) Field of Classification Search
None
See application file for complete search history.

(56) References Cited

U.S. PATENT DOCUMENTS

| 2007/0023082 | A1* | 2/2007 | Manivannan et al. | 136/258 |
| 2008/0230122 | A1* | 9/2008 | Terakawa | 136/261 |
| 2009/0211627 | A1* | 8/2009 | Meier et al. | 136/255 |
| 2010/0144122 | A1* | 6/2010 | Cao et al. | 438/478 |
| 2011/0097878 | A1* | 4/2011 | Olgado | 438/478 |
| 2012/0108002 | A1* | 5/2012 | Lee et al. | 438/96 |

FOREIGN PATENT DOCUMENTS

| JP | 11-251609 A | 9/1999 |
| JP | 2004-056113 A | 2/2004 |
| JP | 2007-277617 A | 10/2007 |
| JP | 2010-034162 A | 2/2010 |

* cited by examiner

*Primary Examiner* — Julio J Maldonado
*Assistant Examiner* — Harpreet Singh
(74) *Attorney, Agent, or Firm* — Marvin A. Motsenbocker; Mots Law, PLLC

(57) ABSTRACT

The present invention is a solar cell 500 comprising the substrate 510 made of a crystalline semiconductor, an i-type semiconductor layer 520a and an i-type semiconductor layer 520b each made of an amorphous semiconductor, and a first-conductivity type semiconductor layer 530 and a second-conductivity type semiconductor layer 540 each made of an amorphous semiconductor, in which by catalytic chemical vapor deposition in which catalyzers decompose raw gas when being heated by receiving an electric current, the i-type semiconductor layer 520a is formed on the principle plane 515a by the catalyzer placed at the position facing the principle plane 515a, the i-type semiconductor layer 520b is formed on the principle plane 515b by the catalyzer placed at the position facing the principle plane 515b are formed on the i-type semiconductor layer 520a and the i-type semiconductor layer 520b on the substrate 510.

13 Claims, 10 Drawing Sheets

SOLAR CELL AND METHOD FOR MANUFACTURING SOLAR CELL

CROSS REFERENCE TO RELATED APPLICATIONS

This application is a continuation application of International Application No. PCT/JP2011/058270, filed on Mar. 31, 2011, entitled "METHOD FOR MANUFACTURING SOLAR CELL, AND SOLAR CELL," which claims priority based on Article 4 of Patent Cooperation Treaty from prior Japanese Patent Applications No. 2010-083217, filed on Mar. 31, 2010, the entire contents of which are incorporated herein by reference.

TECHNICAL FIELD

The present invention relates to a solar cell, and a method for manufacturing a solar cell in which intrinsic semiconductor layers are formed on both principal planes of a substrate made of a semiconductor material.

BACKGROUND ART

Since clean and inexhaustible solar energy can be directly converted into electrical energy, solar cells are expected to become a new energy source.

Heretofore, there has been known a solar cell including intrinsic semiconductor layers (i-type semiconductor layers) formed on both principal planes of a substrate made of a crystalline semiconductor and made of an amorphous semiconductor without addition of a dopant. In this solar cell, a first-conductivity type semiconductor layer (such as an n-type semiconductor layer) is formed on top of the i-type semiconductor layer formed on one principle plane. A second-conductivity type semiconductor layer (such as a p-type semiconductor layer) is formed on top of the i-type semiconductor layer formed on the other principal plane.

Plasma chemical vapor deposition (hereinafter referred to as plasma CVD) is generally used as a method for manufacturing such a solar cell (Patent Document 1, for example).

Specifically, a substrate made of single crystalline silicon is conveyed into a first reaction chamber. At this time, in order to form the semiconductor layer only on the one principle plane of the substrate, the other principle plane of the substrate is covered with a tray, for example. The i-type semiconductor layer is formed on the first principal plane of the conveyed substrate by plasma CVD. The substrate on which the i-type semiconductor layer is formed is conveyed into a second reaction chamber. After conveyance, the first-conductivity type semiconductor layer is formed on top of the i-type semiconductor layer by plasma CVD. The substrate on which the first-conductivity type semiconductor layer is formed is taken out of the second reaction chamber. Subsequently, in order to form the semiconductor layer only on the other principle plane of the taken-out substrate, the one principle plane of the substrate is covered with a tray, for example. The substrate having its first principal plane covered is conveyed into the first reaction chamber. The i-type semiconductor layer is formed on the other principal plane of the conveyed substrate by plasma CVD. The substrate having the i-type semiconductor layer formed on the other principle plane thereof is conveyed into a third reaction chamber. After conveyance, the second-conductivity type semiconductor layer is formed on top of the i-type semiconductor layer by plasma CVD. The substrate having the first-conductivity type semiconductor layer and the second-conductivity type semiconductor layer formed thereon is taken out of the third reaction chamber. A transparent conductive film having optical transparency, such as an ITO, is formed by sputtering on top of each of the first-conductivity type semiconductor layer and the second-conductivity type semiconductor layer. A collecting electrode is formed by screen printing on each of the transparent conductive films. A solar cell has been manufactured through these processes.

Note that the semiconductor layer of the first conductivity type is of any conductivity type of p-type and n-type, and the second conductivity type is the other conductivity type.

PRIOR ART DOCUMENT

Patent Document
  Patent Document 1: Japanese patent application publication No. Hei 11-251609

SUMMARY OF THE INVENTION

As has been described, in the conventional technique, the i-type semiconductor layer is formed on the other principle plane after the formation of the first-conductivity type semiconductor layer. Specifically, while the first-conductivity type semiconductor layer is formed on the one principle plane of the substrate, the surface of the other principle plane of the substrate is exposed. Although the other principle plane of the substrate is covered with a tray or the like at this time, there is a gap between the other principle plane and the tray. For this reason, during the process of forming the first-conductivity type semiconductor layer, a dopant gas being a raw material of the first-conductivity type semiconductor layer sometimes adheres to the other principle plane of the substrate. In this case, the i-type semiconductor layer is formed in a state where an impurity deriving from the raw material of the first-conductivity type semiconductor layer still adheres to the other principle plane of the substrate. Thus, the impurity is sometimes included in the boundary face between the substrate and the i-type semiconductor layer. This degrades interfacial quality between the substrate and the i-type semiconductor layer, and hence may reduce conversion efficiency of the solar cell manufactured in the above manner. The same goes with a case where the second-conductivity type semiconductor layer is formed prior to the first-conductivity type semiconductor layer.

Since the tray is used for conveyance, the substrate is mounted on and dismounted from the tray. Accordingly, it is difficult to eliminate the gap between the substrate and the other principle plane to prevent entrance of the dopant gas, which is a gaseous body.

The present invention has been made in view of such a situation, and aims to inhibit a dopant from entering the boundary face between a substrate and each i-type semiconductor layer when forming i-type semiconductor layers on both principle planes of the substrate, and thereby to provide a solar cell and a method for manufacturing a solar cell with improved conversion efficiency.

To solve the above described problem, the present invention has a feature below. The feature of the present invention is summarized as a method for manufacturing a solar cell including: a substrate made of a crystalline semiconductor and having a first principle plane and a second principle plane, an intrinsic semiconductor layer made of an amorphous semiconductor, and a first semiconductor layer and a second semiconductor layer each made of an amorphous semiconductor, in which one of the first semiconductor layer and the second semiconductor layer is of the same conductivity type as the substrate, and the other is of the conductivity type opposite from the substrate, the method comprising: step S1 of forming the intrinsic semiconductor layer on each of the first principle plane and the second principle plane of the substrate by catalytic chemical vapor deposition; and step S2 of forming any one of the first semiconductor layer and the second semiconductor layer on at least one of the intrinsic semiconductor layers respectively formed on both the principle planes of the substrate, wherein in the step S1, catalyzers that decompose raw gas when being heated by receiving an electric current include a first catalyzer and a second catalyzer, and the first catalyzer is disposed at a position facing the first principle plane in the step S1, and the second catalyzer is disposed at a position facing the second principle plane in the step S1.

MODES FOR CARRYING OUT THE INVENTION

Figure 1:
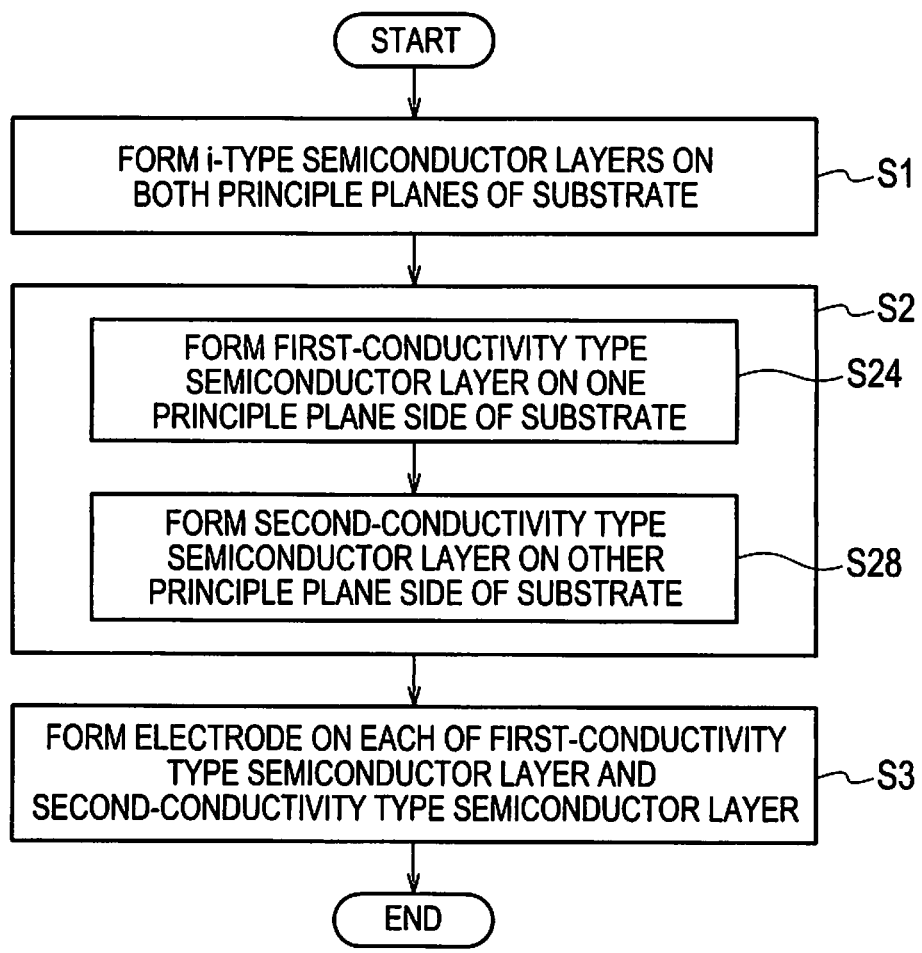
FIG. 1 is a flowchart for describing a method for manufacturing a solar cell 500A according to first and third embodiments of the present invention.

A solar cell 500 according to an embodiment of the present invention will be described with reference to the drawings. In the following description of the drawings, identical or similar reference numerals are assigned to identical or similar components. The drawings are schematic, thus it should be noted that the dimensions are not shown to scale. Accordingly, specific dimensions should be recognized in consideration of the following description. Also, there are inevitably included some portions of the drawings between which a dimensional relationship and/or a scale are inconsistent.

(1) First Embodiment (Method for Manufacturing Solar Cell 500A)

Figure 2:
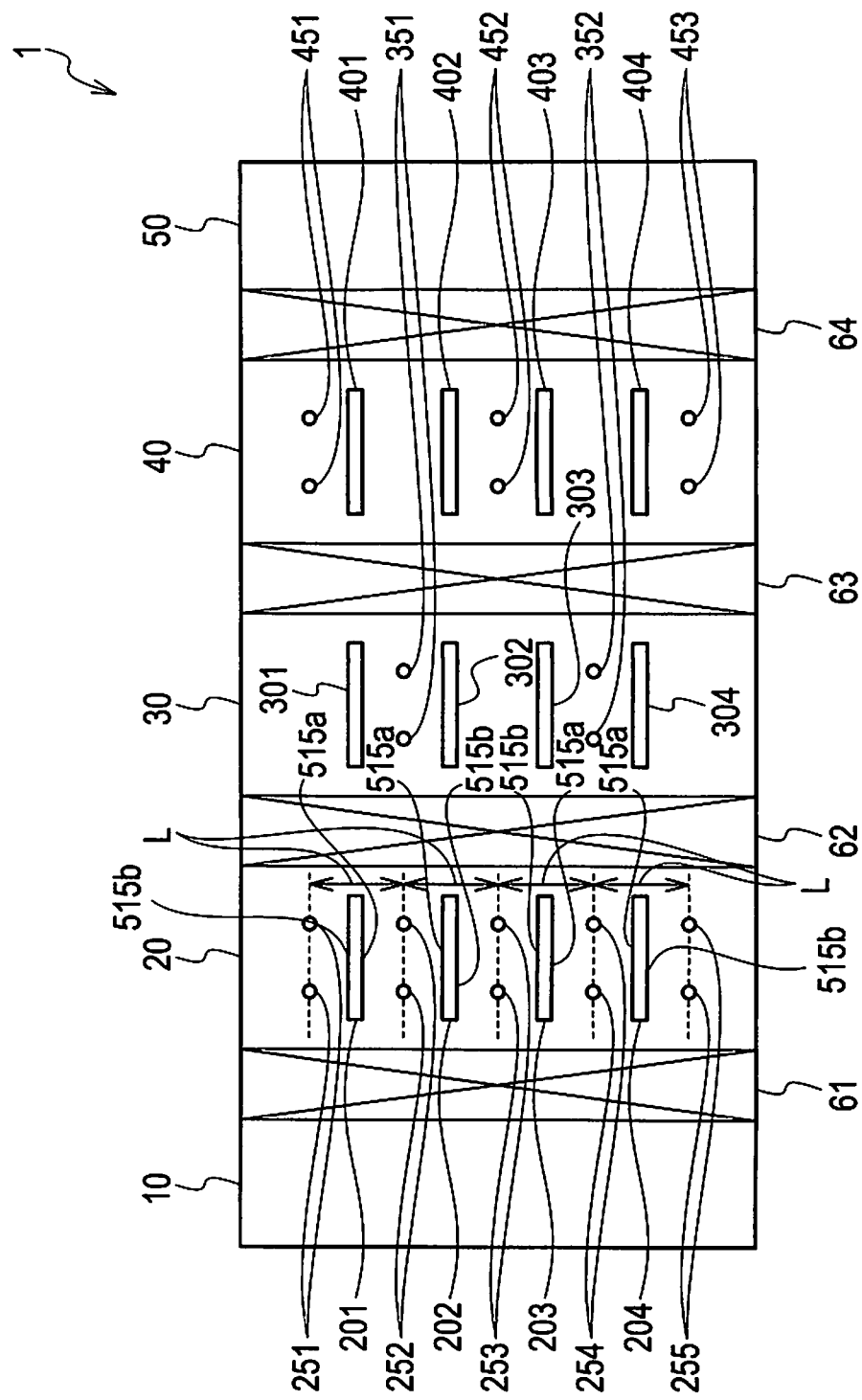
FIG. 2 is a schematic-configuration top view of a semiconductor forming equipment 1 used in the method for manufacturing the solar cell 500A according to the first and fourth embodiments of the present invention.
Figure 3:
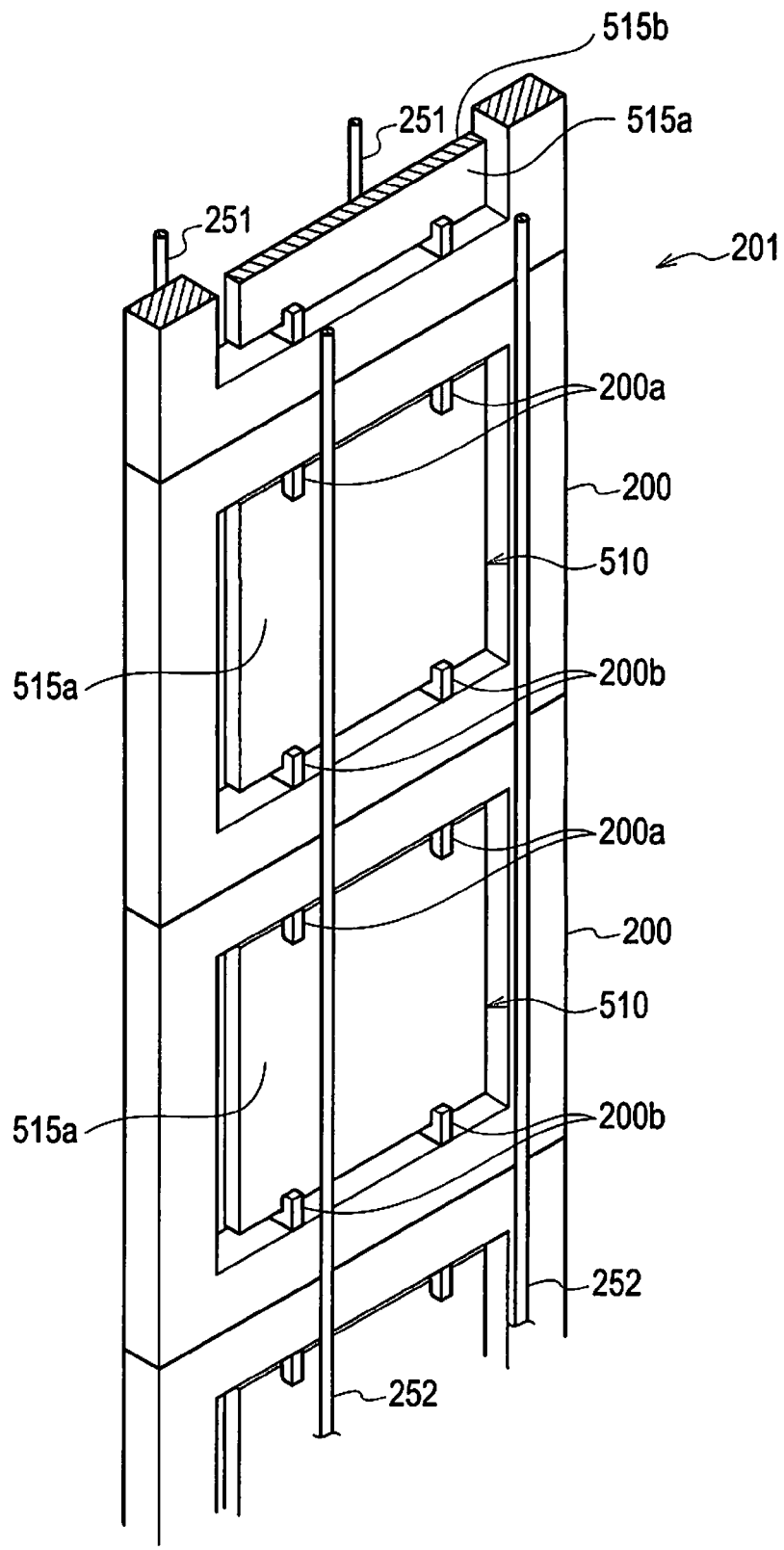
FIG. 3 is a fragmentary perspective view of a substrate conveying tray 201 according to the first, second and fourth embodiments of the present invention in step S1.
Figure 4:
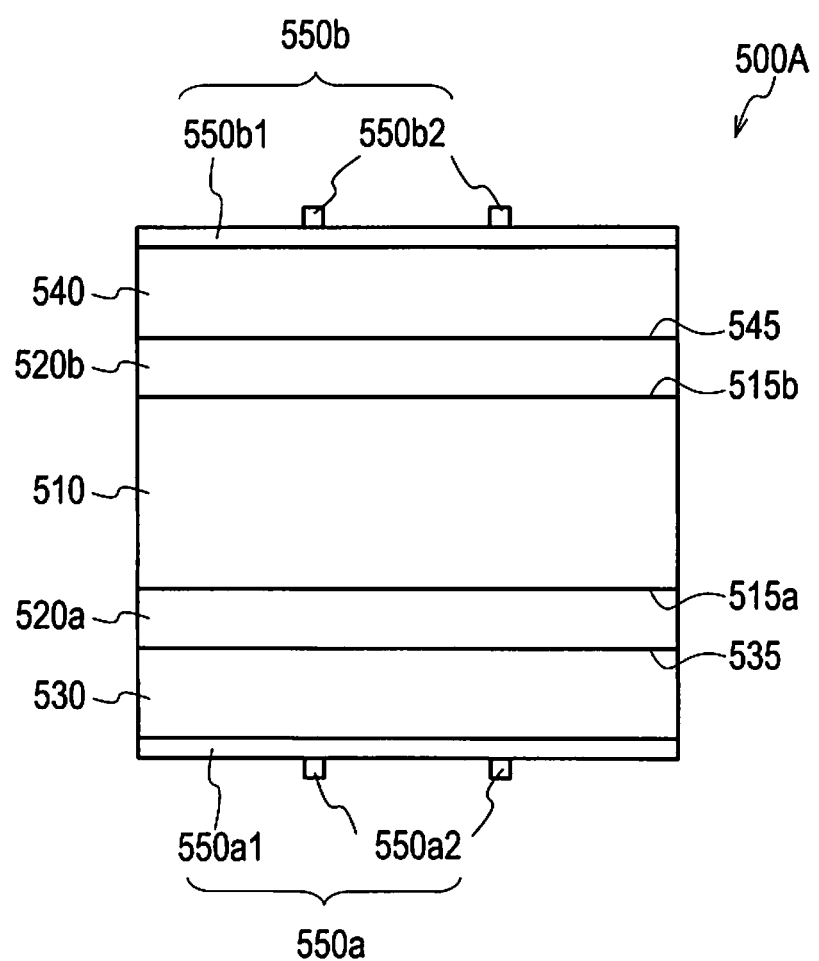
FIG. 4 is a cross section of the solar cell 500A according to the first, second and third embodiments of the present invention.

A method for manufacturing a solar cell 500A according to a first embodiment of the present invention will be described by referring to FIG. 1 to FIG. 4. FIG. 1 is a flowchart for describing the method for manufacturing the solar cell 500A according to this embodiment. FIG. 2 is a schematic-configuration top view of a semiconductor forming equipment 1 used in the method for manufacturing the solar cell 500A according to this embodiment. FIG. 3 is a fragmental perspective view of a substrate conveying tray 201 according to this embodiment in step S1. FIG. 4 is a cross section of the solar cell 500A according to this embodiment.

As shown in FIG. 1, the method for manufacturing the solar cell 500A includes step S1 to step S3.

Step S1 is a step of respectively forming an i-type semiconductor layer 520a and an i-type semiconductor layer 520b on both principle planes of a substrate 510 by catalytic chemical vapor deposition, the substrate 510 being made of a semiconductor material. Firstly, the substrate 510 is prepared. The substrate 510 according to this embodiment is a substrate made of a crystalline semiconductor such as an n-type or a p-type single-crystalline or polycrystalline silicon. The substrate 510 has one principal plane 515a and another principle plane 515b opposed to each other (see FIG. 4). The substrate 510 is processed into an almost rectangular plate form. The surface of the substrate 510 is etched by an acid or an alkaline solution to remove dirt on the surface thereof. In addition, at least one of the one principle plane 515a and the other principle plane 515b has a texture structure for suppressing reflection of light.

The prepared substrate 510 is set on a substrate conveying tray 200 and conveyed to a semiconductor manufacturing equipment 1.

As shown in FIG. 2, the semiconductor manufacturing equipment 1 includes an auxiliary chamber 10, an i-type layer forming chamber 20, a first-conductivity type layer forming chamber 30, a second-conductivity type layer forming chamber 40, an auxiliary chamber 50, a gate valve 61, a gate valve 62, a gate valve 63, and a gate valve 64. Although not shown, the equipment also includes gate valves for isolating the auxiliary chamber 10 and the auxiliary chamber 50 from the surrounding atmosphere.

In the auxiliary chamber 10, the tray 200 conveyed from ambient air is heated to degas the tray 200 and the substrate 510. In the auxiliary chamber 50, the temperature of the tray 200 is lowered. In the i-type layer forming chamber 20, an i-type semiconductor layer 520a and an i-type semiconductor layer 520b are respectively formed on the principle plane 515a and the principle plane 515b being both principle planes of the substrate 510. In the first-conductivity type layer forming chamber 30, a first semiconductor layer 530 is formed on top of the i-type semiconductor layer 520a. In the second-conductivity type layer forming chamber 40, a second semiconductor layer 540 is formed on top of the i-type semiconductor layer 520b. Note that the first conductive type is the conductive type of one of p and n, and the second conductive type is the other conductive type. Each of the auxiliary chamber 10, the i-type layer forming chamber 20, the first-conductivity type layer forming chamber 30, the second-conductivity type layer forming chamber 40 and the auxiliary chamber 50 is provided with an inlet and an outlet for raw gas, which are not shown. The chambers are connected via the gate valve 61, the gate valve 62, the gate valve 63, or the gate valve 64. Each gate valve is basically closed except for when the tray 200 is moved to the corresponding chamber.

The i-type layer forming chamber 20, the first-conductivity type layer forming chamber 30 and the second-conductivity type layer forming chamber 40 include catalyzers which decompose raw material gas when being heated by receiving an electric current. In the i-type layer forming chamber 20, a catalyzer 251, a catalyzer 252, a catalyzer 253, a catalyzer 254, and a catalyzer 255 are arranged at intervals L. In this embodiment, each of the catalyzer 251 to the catalyzer 255 includes a plurality of catalyst wires. Each catalyst wire is positioned so that the wire extends almost vertically against a bottom surface of the reaction chamber. In addition, each catalyst wire is positioned so that the wire is almost parallel to principle planes of the tray 200. Similarly in the first-conductivity type layer forming chamber 30 and the second-conductivity type layer forming chamber 40, a plurality of catalyzers is arranged at predetermined intervals. Materials of the catalyzer include tungsten, molybdenum, and tantalum.

As shown in FIG. 3, the substrate 510 is set on the tray 200 (tray unit 201). A plurality of trays 200 is connected in series to form a tray unit. The tray 200 is a frame member of an almost rectangular shape. Two supporting members 200a are attached to an upper portion inside the frame of the tray 200 (i.e., one end side of the direction in which the trays 200 are arranged in series). Two supporting members 200b are attached to a bottom portion inside the frame of the tray 200 (i.e., the other end side of the direction in which the trays 200 are arranged in series). The substrate 510 is kept from coming off the tray 200 during step S1 by being supported by these supporting members 200a and supporting members 200b.

The tray 200 with the substrate 510 set thereon is conveyed into the auxiliary chamber 10. After enclosing the auxiliary chamber 10, air is exhausted from the outlet so that the amount of vacuum inside the auxiliary chamber 10 reaches a predetermined amount. Inside the i-type layer forming chamber 20, air is exhausted from the outlet and a predetermined amount of vacuum is held. The tray 200 is moved from the auxiliary chamber 10 to the i-type layer forming chamber 20 by a conveying system not shown. As shown in FIG. 2 and FIG. 3, the substrate 510 set on the tray unit is conveyed to a certain position so that the principle plane 515a and the principle plane 515b of the substrate 510 face the corresponding catalyzers. Specifically, the tray unit 201 is conveyed to a position interposed between the catalyzer 251 and the catalyzer 252. The catalyzer 251 faces the principle plane 515b of the substrate 510 set on the tray unit 201. The catalyzer 252 faces the principle plane 515a of the substrate 510 set on the tray unit 201, and faces the principle plane 515a of the substrate 510 set on a tray unit 202. The catalyzer 253 faces the principle plane 515b of the substrate 510 set on the tray unit 202, and faces the principle plane 515b of the substrate 510 set on a tray unit 203. The catalyzer 254 faces the principle plane 515a of the substrate 510 set on the tray unit 203, and faces the principle plane 515a of the substrate 510 set on a tray unit 204. The catalyzer 255 faces the principle plane 515b of the substrate 510 set on the tray unit 204.

In other words, the catalyzer 252 and the catalyzer 254 face the principle planes 515a of the substrates 510. The catalyzer 251, the catalyzer 253 and the catalyzer 255 face the principle planes 515b of the substrates 510. To be precise, in this embodiment, the catalyzers facing the principle planes 515a of the substrate 510 and the catalyzers facing the principle planes 515b of the substrate 510 are arranged alternately, the catalyzer 252 and the catalyzer 254 facing the principle planes 515a of the substrates 510, and the catalyzer 251, the catalyzer 253 and the catalyzer 255 facing the principle planes 515b of the substrates 510.

The catalyzer 251, the catalyzer 252, the catalyzer 253, the catalyzer 254, and the catalyzer 255 are energized so that their temperatures are increased. $SiH_4$ and $H_2$ being reactant gases are introduced into the i-type layer forming chamber 20. The introduced reactant gases are decomposed by the catalyzers and accumulate on the principle plane 515a and the principle plane 515b of the substrate 510. Hence, the i-type semiconductor layer 520a is formed on the principle plane 515a of the substrate 510, and the i-type semiconductor layer 520b is formed on the principle plane 515b of the substrate 510.

A plurality of catalyzers including the catalyzer 251, the catalyzer 252, the catalyzer 253, the catalyzer 254, and the catalyzer 255 is arranged at intervals L. The substrate 510 set on the tray unit 201 is inserted in the interval L between the catalyzer 251 and the catalyzer 252. The tray unit 202, a tray unit 203 and a tray unit 204 are similarly inserted in other intervals L. Accordingly, i-type semiconductor layers can be formed simultaneously on principle planes 515a and principle planes 515b of a plurality of substrates 510.

After forming the i-type semiconductor layer 520a and the i-type semiconductor layer 520b on the substrate 510, introduction of $SiH_4$ and $H_2$ is terminated. Air is exhausted from the outlet so that the amount of vacuum inside the i-type layer forming chamber 20 reaches a predetermined amount.

Step S2 is thereafter carried out. Step S2 is a step of forming the first-conductivity type semiconductor layer 530 and the second-conductivity type semiconductor layer 540 on the substrate 510 on which the i-type semiconductor layer 520a and the i-type semiconductor layer 520b are formed. Step S2 uses catalytic chemical vapor deposition as similar to step S1. Step S2 includes step S24 and step S28.

Step S24 is a step of forming the first-conductivity type semiconductor layer 530 on the surface of the i-type semiconductor layer 520a formed on the principle plane 515a of the substrate 510. Inside the first-conductivity type layer forming chamber 30, air is exhausted from the outlet and a predetermined amount of vacuum is held. The tray 200 is moved from the i-type layer forming chamber 20 to the first-conductivity type layer forming chamber 30 by a conveying system not shown. The tray unit originally located in the position of the tray unit 201 moves to the position of the tray unit 301. Similarly, the tray unit originally located in the position of the tray unit 202 moves to the position of the tray unit 302. The tray unit originally located in the position of the tray unit 203 moves to the position of the tray unit 303. The tray unit originally located in the position of the tray unit 204 moves to the position of the tray unit 304. Specifically, the tray unit 201 and the tray unit 202 are conveyed to such positions as to sandwich the catalyzer 351. The tray unit 203 and the tray unit 204 are conveyed to such positions as to sandwich the catalyzer 352.

The catalyzer 351 and the catalyzer 352 are energized so that their temperatures are increased. $SiH_4$ being a reactant gas, and a doping gas (such as $B_2H_6$ or $PH_3$, for example) are introduced into the first-conductivity type layer forming chamber 30. The introduced reactant gases are decomposed by the catalyzers and accumulate on the principle plane 515a side of the substrate 510. Hence, the first-conductivity type semiconductor layer 530 is formed on the surface of the i-type semiconductor layer 520a formed on the principle plane 515a of the substrate 510. The first-conductivity type semiconductor layer 530 is made of an amorphous semiconductor.

The catalyzer 351 faces the principle plane 515a of the substrate 510 set on the tray unit 301. In addition, the catalyzer 351 also faces the principle plane 515a of the substrate 510 set on the tray unit 302. Accordingly, the first-conductivity type semiconductor layers 530 can be formed simultaneously on the principle plane 515a of the substrate 510 and on the principle plane 515a of the substrate 510. The same goes with the catalyzer 352.

As shown in FIG. 2, the catalyzer 351 and the catalyzer 352 are arranged at a predetermined interval. The tray unit 302 and the tray unit 303 are located in the interval. The catalyzer 351 is in a position facing the principle plane 515a of the substrate 510 set on the tray unit 302. Specifically, the tray unit 302 is positioned between the catalyzer 351 and the tray unit 303. For this reason, the first-conductivity type semiconductor layer 530 is not formed on the principle plane 515b of the substrate 510 set on the tray unit 302.

After forming the first-conductivity type semiconductor layer 530 of a predetermined thickness on the principle plane 515a of the substrate 510, introduction of $SiH_4$ and the doping gas is terminated. Air is exhausted from the outlet so that the amount of vacuum inside the first-conductivity type layer forming chamber 30 reaches a predetermined amount.

Step S28 is thereafter carried out. Step S28 is a step of forming the second-conductivity type semiconductor layer 590 on top of the i-type semiconductor layer 520b formed on the principle plane 515b of the substrate 510. The tray 200 is moved from the first-conductivity type layer forming chamber 30 to the second-conductivity type layer forming chamber 40 by a conveying system not shown. Inside the second-conductivity type layer forming chamber 40, air is exhausted from the outlet and a predetermined amount of vacuum is held. The tray unit originally located in the position of the tray unit 301 moves to the position of the tray unit 401. Similarly, the tray unit originally located in the position of the tray unit 302 moves to the position of the tray unit 402. The tray unit originally located in the position of the tray unit 303 moves to the position of the tray unit 403. The tray unit originally located in the position of the tray unit 304 moves to the position of the tray unit 404.

Specifically, the tray unit 301 is conveyed to a certain position so that the principle plane 515b of the substrate 510 faces the catalyzer 451. The tray unit 302 and the tray unit 303 are conveyed to such positions as to sandwich the catalyzer 452. The tray unit 304 is conveyed to a certain position so that the principle plane 515b of the substrate 510 faces the catalyzer 453.

The catalyzer 451, the catalyzer 452 and the catalyzer 453 are energized so that their temperatures are increased. $SiH_4$ being a reactant gas, and a doping gas are introduced into the second-conductivity type layer forming chamber 40. The introduced reactant gases are decomposed by the catalyzers and accumulate on the principle plane 515b side of the substrate 510. Hence, the second-conductivity type semiconductor layer 540 of the conductivity type opposite from the substrate 510 is formed on the surface of the i-type semiconductor layer 520b formed on the principle plane 515b of the substrate 510.

The catalyzer 452 faces the principle plane 515b of the substrate 510 set on the tray unit 402. In addition, the catalyzer 452 also faces the principle plane 515b of the substrate 510 set on the tray unit 403. Accordingly, the second-conductivity type semiconductor layers 540 can be formed simultaneously on the principle plane 515b of the substrate 510 and on the principle plane 515b of the substrate 510. The second-conductivity type semiconductor layer 540 is made of an amorphous semiconductor.

As shown in FIG. 2, the catalyzer 451, the catalyzer 452 and the catalyzer 453 are arranged at predetermined intervals. The tray unit 401 and the tray unit 402 are located in the interval between the catalyzer 451 and the catalyzer 452. The catalyzer 451 is in a position facing the principle plane 515b of the substrate 510 set on the tray unit 401. Specifically, the tray unit 401 is positioned between the catalyzer 451 and the tray unit 402. For this reason, the second-conductivity type semiconductor layer 540 is not formed on the principle plane 515a of the substrate 510 set on the tray unit 402. The same goes with the substrates 510 set on the other tray units.

After forming the first-conductivity type semiconductor layer 530 of a predetermined thickness on the principle plane 515a of the substrate 510, introduction of $SiH_4$ and the doping gas is terminated. Air is exhausted from the outlet so that the amount of vacuum inside the second-conductivity type layer forming chamber 40 reaches a predetermined amount.

The tray 200 is moved from the second-conductivity type layer forming chamber 40 to the auxiliary chamber 50 by a conveying system not shown. The tray unit moved to the auxiliary chamber 50 is conveyed from the semiconductor manufacturing equipment 1.

Step S3 is thereafter carried out. Step S3 is a step of respectively forming an electrode 550a and an electrode 550b on the first-conductivity type semiconductor layer 530 and on the second-conductivity type semiconductor layer 540.

The substrate 510 is detached from the tray 200 conveyed from the semiconductor manufacturing equipment 1. The electrode 550a is formed on top of the first-conductivity type semiconductor layer 530 of the substrate 510. The electrode 550b is formed on top of the second-conductivity type semiconductor layer 540 of the substrate 510. The electrode 550a includes a transparent conductive layer 550a1 and a collecting electrode 550a2, whereas the electrode 550b includes a transparent conductive layer 550b1 and a collecting electrode 550b2. The transparent conductive layer 550a1 and the transparent conductive layer 550b1 may be formed by use of a transparent conductive oxide such as indium oxide, tin oxide or zinc oxide. The collecting electrode 550a2 and the collecting electrode 550b2 may be formed by use of metal such as silver or copper, or a low resistivity material containing metal such as alloyed metal.

The solar cell 500A shown in FIG. 4 is manufactured through the above-mentioned processes. According to the above manufacturing method, the i-type semiconductor layer 520a and the i-type semiconductor layer 520b are already formed at the time of forming the first-conductivity type semiconductor layer 530 and the second-conductivity type semiconductor layer 540. As a result, the impurity with which the first-conductivity type semiconductor layer 530 and the second-conductivity type semiconductor layer 540 are doped can be prevented from entering the boundary face between the substrate 510 and the i-type semiconductor layer 520a, as well as the boundary face between the substrate 510 and the i-type semiconductor layer 520b. Hence, the boundary face between the substrate 510 and the i-type semiconductor layer 520a, as well as the boundary face between the substrate 510 and the i-type semiconductor layer 520b can be kept clean. Degradation of interfacial quality can thus be curbed, so that a solar cell of high photoelectric conversion efficiency can be manufactured.

In plasma CVD using parallel plate electrodes, a principle plane on which a semiconductor layer needs to be formed is positioned to face one electrode, and a substrate made of a semiconductor material is placed on the other electrode. After placing the substrate, high-frequency power is applied to the electrodes to generate an electrical discharge between the electrodes, and thereby form the semiconductor layer. For this reason, in order to form the semiconductor layers on one principle plane and the other principle plane of the substrate, the substrate needs to be taken out of the reaction chamber to switch the positions of the one principle plane and the other principle plane.

According to this embodiment, the method includes step S1 of forming the intrinsic semiconductor layers on the one principle plane and the other principle plane of the substrate. In step S1, the catalyzers which decompose raw gas when being heated by receiving an electric current includes the first catalyzer and the second catalyzer, wherein the first catalyzer is placed at a position facing the one principle plane in step S1, and the second catalyzer is placed at a position facing the other principle plane in step S1. To be specific, the i-type semiconductor layer 520a is formed on the principle plane 515a by the catalyzer placed at the position facing the principle plane 515a, and the i-type semiconductor layer 520b is formed on the principle plane 515b by the catalyzer placed at the position facing the principle plane 515b. Accordingly, the i-type semiconductor layers can be formed on the principle plane 515a and the principle plane 515b without having to take out the substrate 510 from the i-type layer forming chamber 20 and switching the positions of the principle plane 515a and the principle plane 515b. Thus, a simpler manufacturing process and a shorter manufacturing time can be achieved for the solar cell 500.

In the method for manufacturing the solar cell 500 according to this embodiment, the catalyzer 252 faces the principle plane 515a of the substrate 510 set on the tray unit 201, and the catalyzer 252 also faces the principle plane 515a of the substrate 510 set on the tray unit 202, for example. Accordingly, the i-type semiconductor layers 520a can be simultaneously formed on the principle plane 515a of the substrate 510 and on the principle plane 515a of the substrate 510.

In the method for manufacturing the solar cell 500 according to this embodiment, a plurality of catalyzers including the catalyzer 251, the catalyzer 252, the catalyzer 253, the catalyzer 254 and the catalyzer 255, is arranged at intervals L. The substrate 510 set on the tray unit 201 is inserted in the interval L between the catalyzer 251 and the catalyzer 252. The tray unit 202, the tray unit 203 and the tray unit 204 are similarly inserted in other intervals L. Accordingly, i-type semiconductor layers can be formed simultaneously on principle planes 515a and principle planes 515b of a plurality of substrates 510.

(2) Second Embodiment (Method for Manufacturing Solar Cell 500A)

Figure 5:
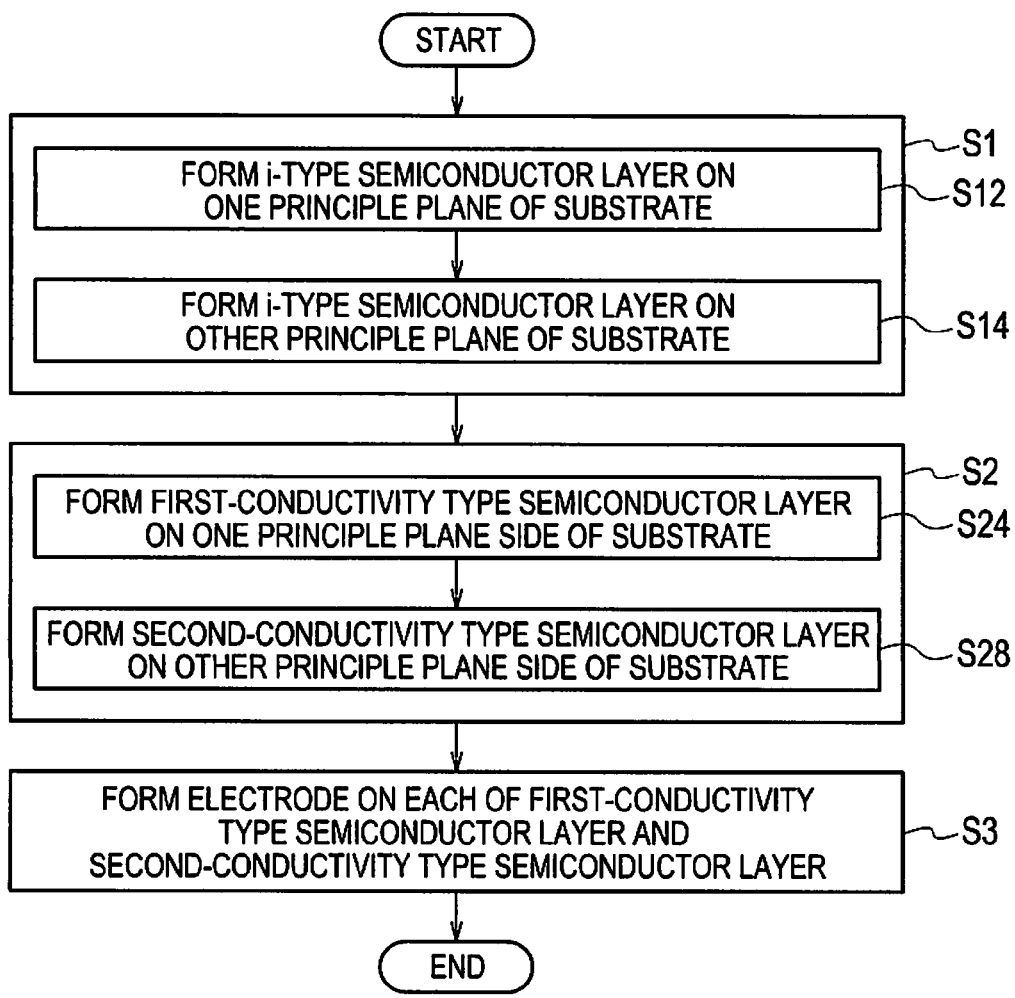
FIG. 5 is a flowchart for describing a method for manufacturing a solar cell 500A according to the second embodiment of the present invention.
Figure 6:
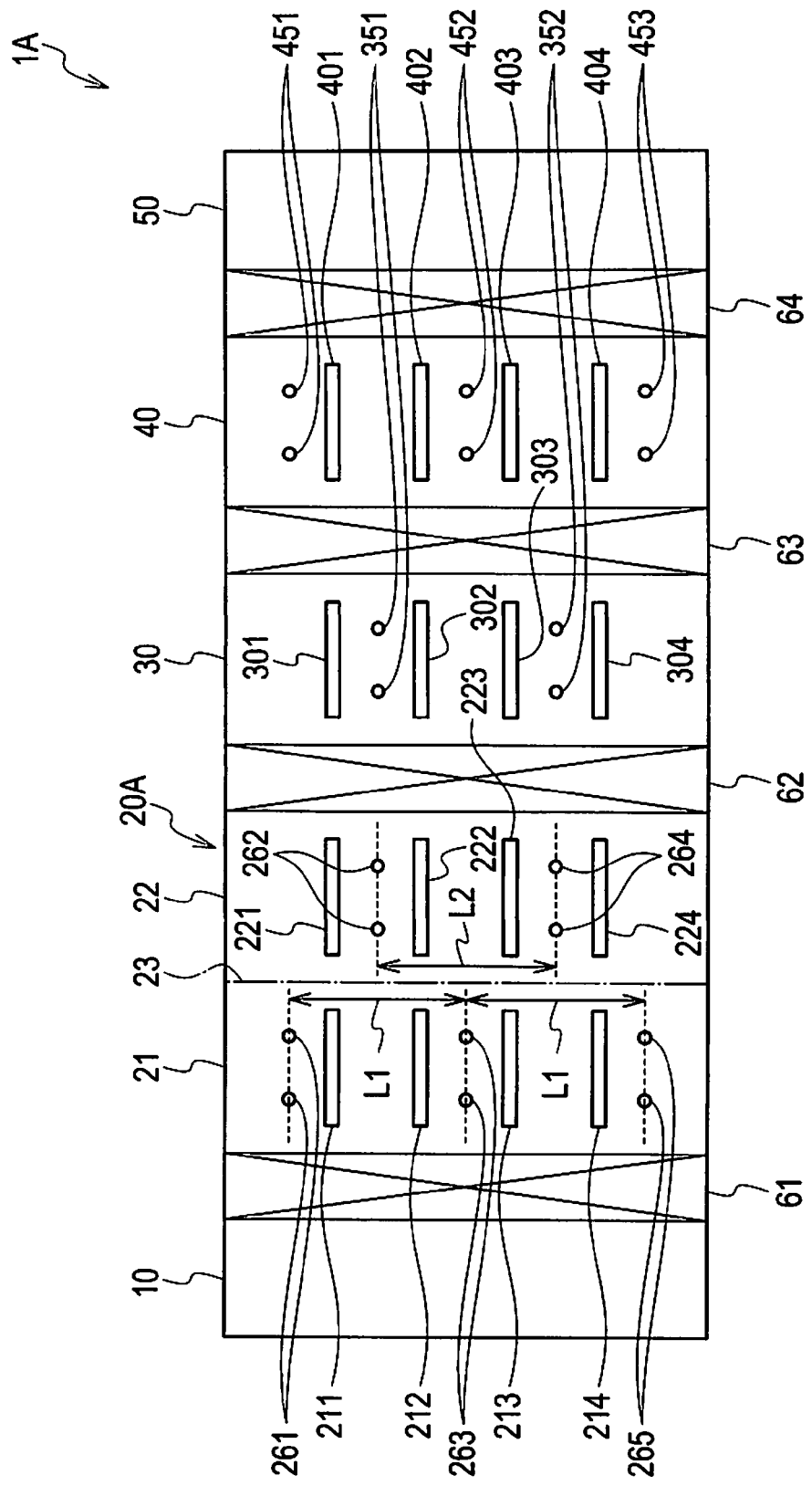
FIG. 6 is a schematic-configuration top view of a semiconductor forming equipment 1A used in the method for manufacturing the solar cell 500A according to the second embodiment of the present invention.

A method for manufacturing a solar cell 500A according to a second embodiment of the present invention will be described by referring to FIG. 4 to FIG. 6. Hereinbelow, descriptions are omitted for parts that are the same as the method for manufacturing the solar cell 500A according to the first embodiment. In other words, descriptions will be given mainly on points different from the method for manufacturing the solar cell 500A according to the first embodiment. FIG. 5 is a flowchart for describing the method for manufacturing the solar cell 500A according to this embodiment. FIG. 6 is a schematic-configuration top view of a semiconductor forming equipment 1A used in the method for manufacturing the solar cell 500A according to this embodiment.

As shown in FIG. 5, the method for manufacturing the solar cell 500A according to the second embodiment includes step S1 to step S3.

Step S1 is a step of respectively forming an i-type semiconductor layer 520a and an i-type semiconductor layer 520b on both principle planes of a substrate 510 by catalytic chemical vapor deposition, the substrate 510 being made of a semiconductor material. Step S1 includes step S12 and step S14.

Step S12 is a step of forming the i-type semiconductor layer 520b on a principle plane 515b of the substrate 510. Firstly, as in the above method for manufacturing the solar cell 500A, the substrate 510 is prepared. The prepared substrate 510 is set on a tray 200 and conveyed to the semiconductor manufacturing equipment 1A.

As shown in FIG. 6, the semiconductor manufacturing equipment 1A includes an auxiliary chamber 10, an i-type layer forming chamber 20A, a first-conductivity type layer forming chamber 30, a second-conductivity type layer forming chamber 40, an auxiliary chamber 50, a gate valve 61, a gate valve 62, a gate valve 63, and a gate valve 64.

The i-type layer forming chamber 20A is partitioned into an i-type layer forming chamber 21 and an i-type layer forming chamber 22 by an openable and closeable partition wall 23. As similar to the other chambers, each of the i-type layer forming chamber 21 and the i-type layer forming chamber 22 is provided with an inlet and outlet for gas, which are not shown.

In the i-type layer forming chamber 21, a catalyzer 261, a catalyzer 263 and a catalyzer 265 are arranged at intervals L1. In the i-type layer forming chamber 22, a catalyzer 262 and a catalyzer 264 are arranged at an interval L2. Intervals L1 and L2 are larger than interval L shown in FIG. 2.

The tray 200 on which the substrate 510 is set is conveyed into the auxiliary chamber 10. After enclosing the auxiliary chamber 10, air is exhausted from the outlet so that the amount of vacuum inside the auxiliary chamber 10 reaches a predetermined amount. Inside the i-type layer forming chamber 21, air is exhausted from the outlet and a predetermined amount of vacuum is held. The tray 200 is moved from the auxiliary chamber 10 to the i-type layer forming chamber 21 by a conveying system not shown. As shown in FIG. 6, tray units are conveyed to certain positions so that the principle planes 515b of the substrates 510 face the corresponding catalyzers. Specifically, the tray unit 211 is conveyed to a certain position so that the principle plane 515b of the substrate 510 faces the catalyzer 261. A tray unit 212 and a tray unit 213 are conveyed to such positions as to sandwich the catalyzer 263. A tray unit 214 is conveyed to a certain position so that the principle plane 515b of the substrate 510 faces the catalyzer 265.

The catalyzer 261, the catalyzer 263, and the catalyzer 265 are energized so that their temperatures are increased. $SiH_4$ and $H_2$ being reactant gases are introduced into the i-type layer forming chamber 21. The introduced reactant gases are decomposed by the catalyzers and accumulate on the principle plane 515b of the substrate 510. Hence, the i-type semiconductor layer 520b is formed on the principle plane 515b of the substrate 510.

After forming the i-type semiconductor layer 520b of a predetermined thickness on the principle plane 515b of the substrate 510, introduction of $SiH_4$ and $H_2$ is terminated. Air is exhausted from the outlet so that the amount of vacuum inside the i-type layer forming chamber 21 reaches a predetermined amount.

Step S14 is thereafter carried out. Step S14 is a step of forming the i-type semiconductor layer 520a on the principle plane 515a of the substrate 510. Inside the i-type layer forming chamber 22, air is exhausted from the outlet and a predetermined amount of vacuum is held. The tray 200 is moved from the i-type layer forming chamber 21 to the i-type layer forming chamber 22 by a conveying system not shown. The tray unit originally located in the position of the tray unit 211 moves to the position of a tray unit 221. Similarly, the tray unit originally located in the position of the tray unit 212 moves to the position of a tray unit 222. The tray unit originally located in the position of the tray unit 213 moves to the position of a tray unit 223. The tray unit originally located in the position of the tray unit 214 moves to the position of a tray unit 224. Specifically, the tray unit 221 and the tray unit 222 are conveyed to such positions as to sandwich the catalyzer 262. The tray unit 223 and the tray unit 224 are conveyed to such positions as to sandwich the catalyzer 264.

The catalyzer 262 and the catalyzer 264 are energized so that their temperatures are increased. $SiH_4$ and $H_2$ being reactant gases are introduced into the i-type layer forming chamber 22. The introduced reactant gases are decomposed by the catalyzers and accumulate on the principle plane 515a side of the substrate 510. Hence, the i-type semiconductor layer 520a is formed on the principle plane 515a of the substrate 510.

After forming the i-type semiconductor layer 520a of a predetermined thickness on the principle plane 515a of the substrate 510, introduction of $SiH_4$ and $H_2$ is terminated. Air is exhausted from the outlet so that the amount of vacuum inside the i-type layer forming chamber 22 reaches a predetermined amount. The following step S2 and step S3 are the same as the above method for manufacturing the solar cell 500A according to the first embodiment. The solar cell 500A shown in FIG. 4 is manufactured through these processes.

In the method for manufacturing the solar cell 500A according to this embodiment, the i-type semiconductor layer 520b is formed on the principle plane 515b of the substrate 510 in step S12, whereas the i-type semiconductor layer 520a is formed on the principle plane 515a of the substrate 510 in step S14. By thus forming the i-type semiconductor layer 520a and the i-type semiconductor layer 520b separately, forming conditions (i.e., temperature, pressure, concentration of reactant gas and the like) can be varied between the i-type semiconductor layer 520a on which the first-conductivity type semiconductor layer 530 is formed and the i-type semiconductor layer 520b on which the second-conductivity type semiconductor layer 540 is formed. Thus, thickness and quality of film can be controlled for the i-type semiconductor layer 520a and the i-type semiconductor layer 520b. Note that the partition wall 23 may be omitted if the i-type semiconductor layer 520a and the i-type semiconductor layer 520b are to be formed under the same condition.

To form an amorphous silicon film by catalytic chemical vapor deposition, a catalyzer is heated at a high temperature such as approximately 1600° C. to 2000° C. In the first embodiment, the substrate 510 is heated by two catalyzers. To be specific, the substrate 510 set on the tray unit 201, for example is heated by radiant heat from the catalyzer 251 and the catalyzer 252. For this reason, to prevent the substrate 510 from being heated excessively, it is preferable to widen the intervals between the substrates 510 and the catalyzers, or to add a mechanism for cooling the substrate 510.

On the other hand, in the second embodiment, the substrate 510 is heated by a single catalyzer. Since less catalyzers heat the substrate 510 in the second embodiment than in the first embodiment, excessive heating of the substrate 510 can be suppressed. Hence, while the first embodiment requires a mechanism for preventing excessive heating of the substrate 510, the second embodiment does not require such a mechanism. In other words, the second embodiment can provide a simpler manufacturing equipment than can the first embodiment.

(3) Third Embodiment (Method for Manufacturing Solar Cell 500A)

Figure 7:
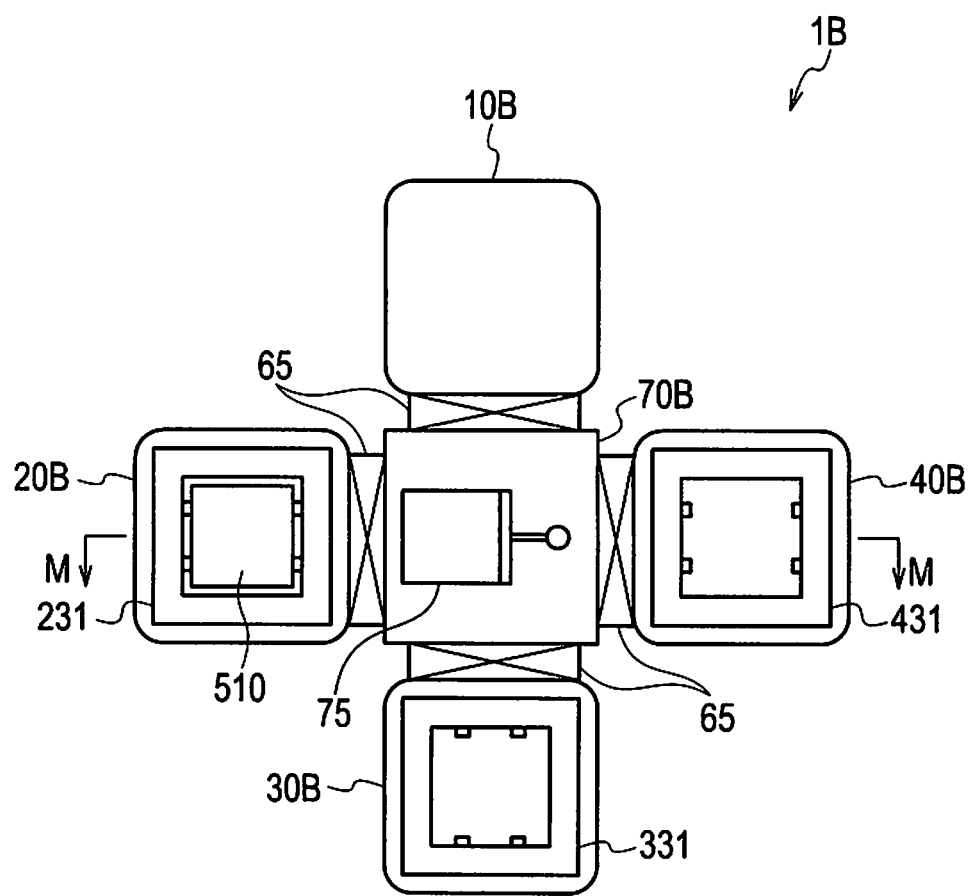
FIG. 7 is a schematic-configuration top view of a semiconductor forming equipment 1B used in the method for manufacturing the solar cell 500A according to the third embodiment of the present invention.
Figure 8:
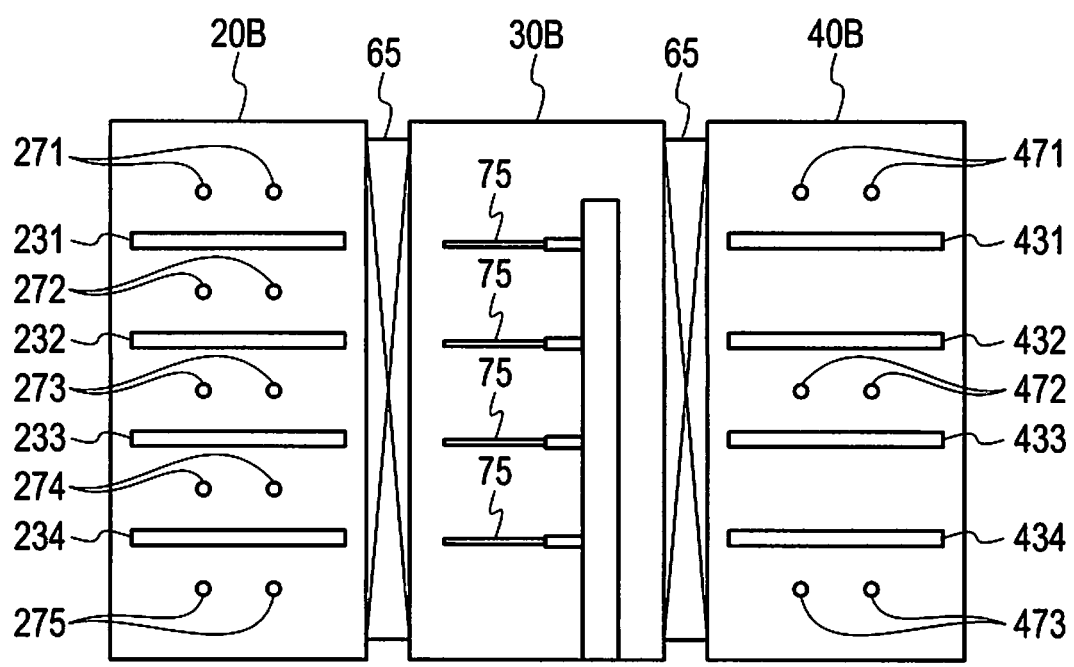
FIG. 8 is a schematic M-M cross section of the semiconductor forming equipment 1B used in the method for manufacturing the solar cell 500A according to the third embodiment of the present invention.

A method for manufacturing a solar cell 500A according to a third embodiment of the present invention will be described by referring to FIG. 1, FIG. 7 and FIG. 8. Hereinbelow, descriptions are omitted for parts that are the same as the method for manufacturing the solar cell 500A according to the first embodiment. In other words, descriptions will be given mainly on points different from the method for manufacturing the solar cell 500A according to the first embodiment. FIG. 7 is a schematic-configuration top view of a semiconductor forming equipment 1B used in the method for manufacturing the solar cell 500A according to the third embodiment of the present invention. Catalyst bodies are omitted. FIG. 8 is a schematic M-M cross section of the semiconductor forming equipment 1B.

As shown in FIG. 7, the semiconductor manufacturing equipment 1B includes an access chamber 10B, an i-type layer forming chamber 20B, a first-conductivity type layer forming chamber 30B, a second-conductivity type layer forming chamber 40B, a conveying chamber 70B and gate valves 65. The access chamber 10B is used when the substrate 510 is carried into the semiconductor manufacturing equipment 1B from outside. The access chamber 10B is also used when the substrate 510 on which a first-conductivity type semiconductor layer 530 and a second-conductivity type semiconductor layer 540 are formed is carried out of the equipment. In the i-type layer forming chamber 20B, an i-type semiconductor layer 520a and an i-type semiconductor layer 520b are formed on the substrate 510. In the first-conductivity type layer forming chamber 30B, the first semiconductor layer 530 is formed on top of the i-type semiconductor layer 520a. In the second-conductivity type layer forming chamber 40B, the second semiconductor layer 540 is formed on top of the i-type semiconductor layer 520b. Each of the access chamber 10B, the i-type layer forming chamber 20B, the first-conductivity type layer forming chamber 30B, the second-conductivity type layer forming chamber 40B and the conveying chamber 70B is provided with an inlet and an outlet for gas, which are not shown.

The conveying chamber 70B is connected to each of the access chamber 10B, the i-type layer forming chamber 20B, the first-conductivity type layer forming chamber 30B and the second-conductivity type layer forming chamber 40B via the gate valve 65. A plurality of transport forks 75 is provided in the conveying chamber 70B. The substrate 510 can be conveyed from the conveying chamber 70B to each of the chambers by this transport fork 75.

Each of the i-type layer forming chamber 20B, the first-conductivity type layer forming chamber 30B and the second-conductivity type layer forming chamber 40B has catalyzers which decompose raw gas when being heated by receiving an electric current. As shown in FIG. 8, in the i-type layer forming chamber 20B, a catalyzer 271, a catalyzer 272, a catalyzer 273, a catalyzer 274 and a catalyzer 275 are arranged at predetermined intervals. Similarly in the first-conductivity type layer forming chamber 30B and the second-conductivity type layer forming chamber 40B, a plurality of catalyzers are arranged at predetermined intervals. Note that the catalyzers in the first-conductivity type layer forming chamber 30B and the catalyzers in the second-conductivity type layer forming chamber 90B are arranged differently. Specifically, the catalyzers in the first-conductivity type layer forming chamber 30B are arranged to face a principle plane 515a of the substrate 510, whereas the catalyzers of the second-conductivity type layer forming chamber 40B are arranged to face a principle plane 515b of the substrate 510.

As similar to the method for manufacturing the solar cell 500A of the first embodiment, the method for manufacturing the solar cell 500A of this embodiment includes step S1 to step S3 shown in FIG. 1.

Step S1 is a step of respectively forming an i-type semiconductor layer 520a and an i-type semiconductor layer 520b on both principle planes of the substrate 510 by catalytic chemical vapor deposition. Prepared substrates 510 are carried into the access chamber 10B from outside. After enclosing the access chamber 10B, air is exhausted from the outlet so that the amount of vacuum inside the access chamber 10B reaches a predetermined amount. Inside the conveying chamber 70B, air is exhausted from the outlet and a predetermined amount of vacuum is held. The gate valve 65 connecting the access chamber 10B and the conveying chamber 70B is opened, and the substrates 510 conveyed into the access chamber 10B are respectively placed on the transport forks 75. The transport forks 75 are returned to the inside of the conveying chamber 70B and the gate valve 65 is closed.

Thereafter, the gate valve 65 connecting the i-type layer forming chamber 20B and the conveying chamber 70B is opened. Inside the i-type layer forming chamber 20B, air is exhausted from the outlet and a predetermined amount of vacuum is held. The substrates 510 are placed on corresponding loading trays provided in the i-type layer forming chamber 20B. As similar to the tray 200, the loading tray is a frame member of an almost rectangular shape. Projections are provided inside the frame. When the substrate 510 is placed on the frame, the projections support edges of the substrate 510, so that it does not drop. A loading tray 231 is fixed between the catalyzer 271 and the catalyzer 272. Similarly, a loading tray 232 is fixed between the catalyzer 272 and the catalyzer 273. A loading tray 233 is fixed between the catalyzer 273 and the catalyzer 274. A loading tray 234 is fixed between the catalyzer 274 and the catalyzer 275. After placing the substrates 510, the transport forks 75 are returned to the inside of the conveying chamber 70B and the gate valve 65 is closed.

As in the above method for manufacturing the solar cell 500A according to the first embodiment, the i-type semiconductor layer 520a is formed on the principle plane 515a of the substrate 510 and the i-type semiconductor layer 520b is formed on the principle plane 515b of the substrate 510 simultaneously by catalytic chemical vapor deposition.

Air is exhausted from the outlet so that the amount of vacuum inside the i-type layer forming chamber 20B reaches a predetermined amount. The gate valve 65 connecting the i-type layer forming chamber 20B and the conveying chamber 70B is opened. The substrates 510 are moved from the respective loading trays in the i-type layer forming chamber 20B onto the corresponding transport forks 75. The transport forks 75 are returned to the inside of the conveying chamber 70B, and the gate valve 65 is closed.

Step S2 is thereafter carried out. Step S2 is a step of forming the first-conductivity type semiconductor layer 530 and the second-conductivity type semiconductor layer 540 on the substrate 510 on which the i-type semiconductor layer 520a and the i-type semiconductor layer 520b are formed. Step S2 uses catalytic chemical vapor deposition as similar to step S1.

The gate valve 65 connecting the first-conductivity type layer forming chamber 30B and the conveying chamber 70B is opened. Inside the first-conductivity type layer forming chamber 30B, air is exhausted from the outlet and a predetermined amount of vacuum is held. The substrates 510 are placed on corresponding loading trays provided in the first-conductivity type layer forming chamber 30B. In order that the first-conductivity type semiconductor layers 530 be formed only on the principle planes 515a of the substrates 510, positional relationships between the loading trays and the catalyzers is the same as the positional relationships employed in the method for manufacturing the solar cell 500A of the first embodiment. After placing the substrates 510 on the loading trays, the transport forks 75 are returned to the inside of the conveying chamber 70B and the gate valve 65 is closed.

As in the above method for manufacturing the solar cell 500A according to the first embodiment, the first-conductivity type semiconductor layer 530 is formed on the i-type semiconductor layer 520a by catalytic chemical vapor deposition.

Air is exhausted from the outlet so that the amount of vacuum inside the first-conductivity type layer forming chamber 30B reaches a predetermined amount. The gate valve 65 connecting the first-conductivity type layer forming chamber 30B and the conveying chamber 70B is opened. The substrates 510 are moved from the respective loading trays in the first-conductivity type layer forming chamber 30B onto the corresponding transport forks 75. The transport forks 75 are returned to the inside of the conveying chamber 70B, and the gate valve 65 is closed.

In the second-conductivity type layer forming chamber 40B, the second-conductivity type semiconductor layer 540 is formed on the surface of the i-type semiconductor layer 520b, in the same manner as was the first-conductivity type semiconductor layer 530 formed on the surface of the i-type semiconductor layer 520a in the first-conductivity type layer forming chamber 30B.

The substrate 510 on which the first-conductivity type semiconductor layer 530 and the second-conductivity type semiconductor layer 540 are formed is conveyed to the access chamber 10B by the transport fork 75. The substrate 510 conveyed to the access chamber 10B is moved out of the equipment. This substrate 510 is subjected to step S3. Step S3 is the same as the above method for manufacturing the solar cell 500A according to the first embodiment. The solar cell 500A according to the third embodiment shown in FIG. 4 is manufactured through these processes.

This embodiment uses the transport fork 75 instead of a substrate conveying tray to convey the substrate 510. To be specific, only the substrate 510 is conveyed in the conveying carried out for the above processes. Accordingly, a tray with a dopant adhered on the surface thereof does not need to be used when forming the first-conductivity type semiconductor layer 530 and the second-conductivity type semiconductor layer 540. As a result, the solar cell 500A according to this embodiment can avoid the influence of a dopant adhered to a tray, unlike other embodiments using a tray. In other words, it is possible to reduce the amount of the dopant entering the boundary face 515a between the substrate 510 and the i-type semiconductor layer 520a, as well as the boundary face 515b between the substrate 510 and the i-type semiconductor layer 520b. Consequently, degradation of interfacial quality can be further curbed, so that a solar cell of even higher photoelectric conversion efficiency can be manufactured.

(4) Fourth Embodiment (Method for Manufacturing Solar Cell 500B)

Figure 9:
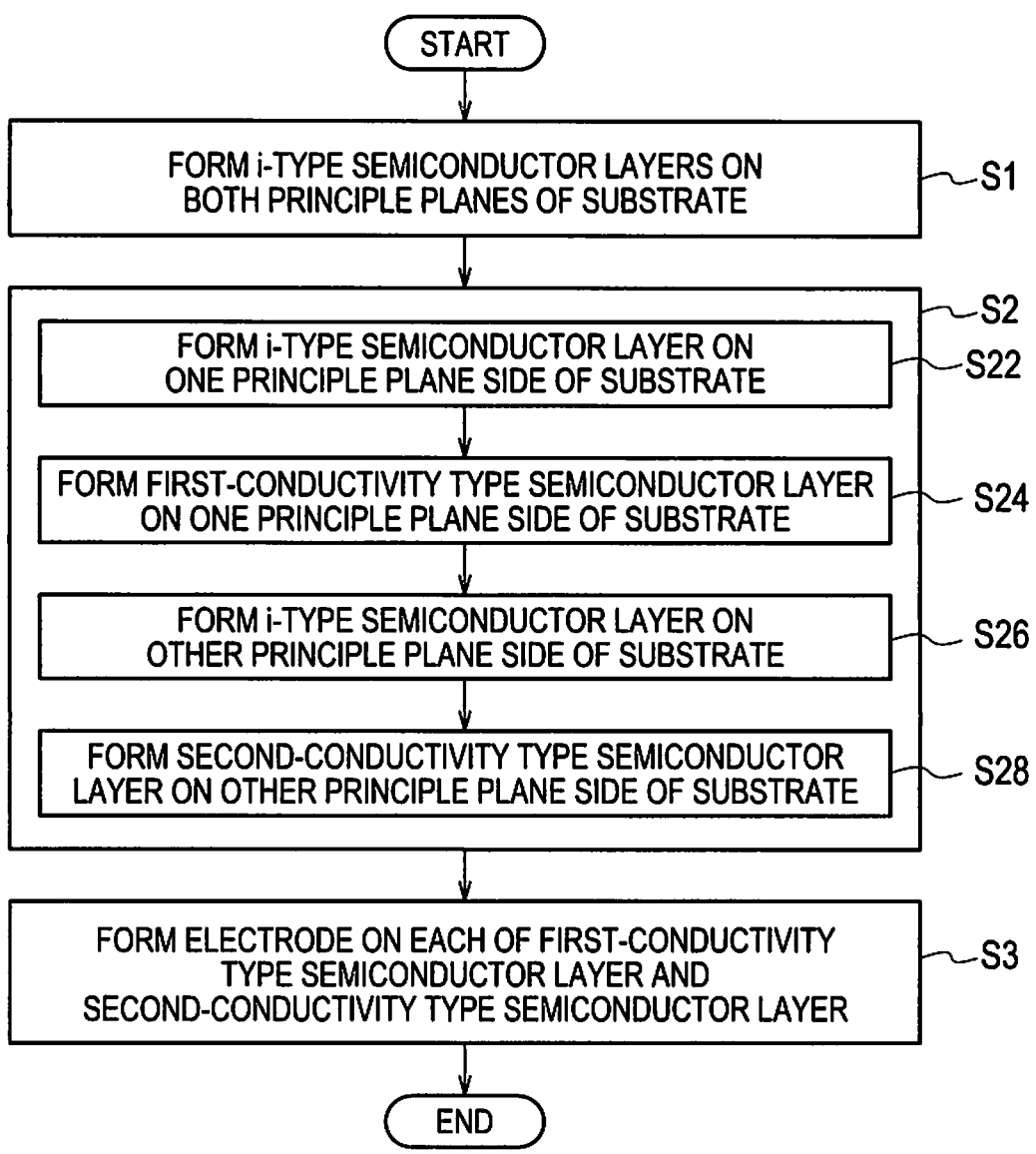
FIG. 9 is a flowchart for describing a method for manufacturing a solar cell 500B according to the fourth embodiment of the present invention.
Figure 10:
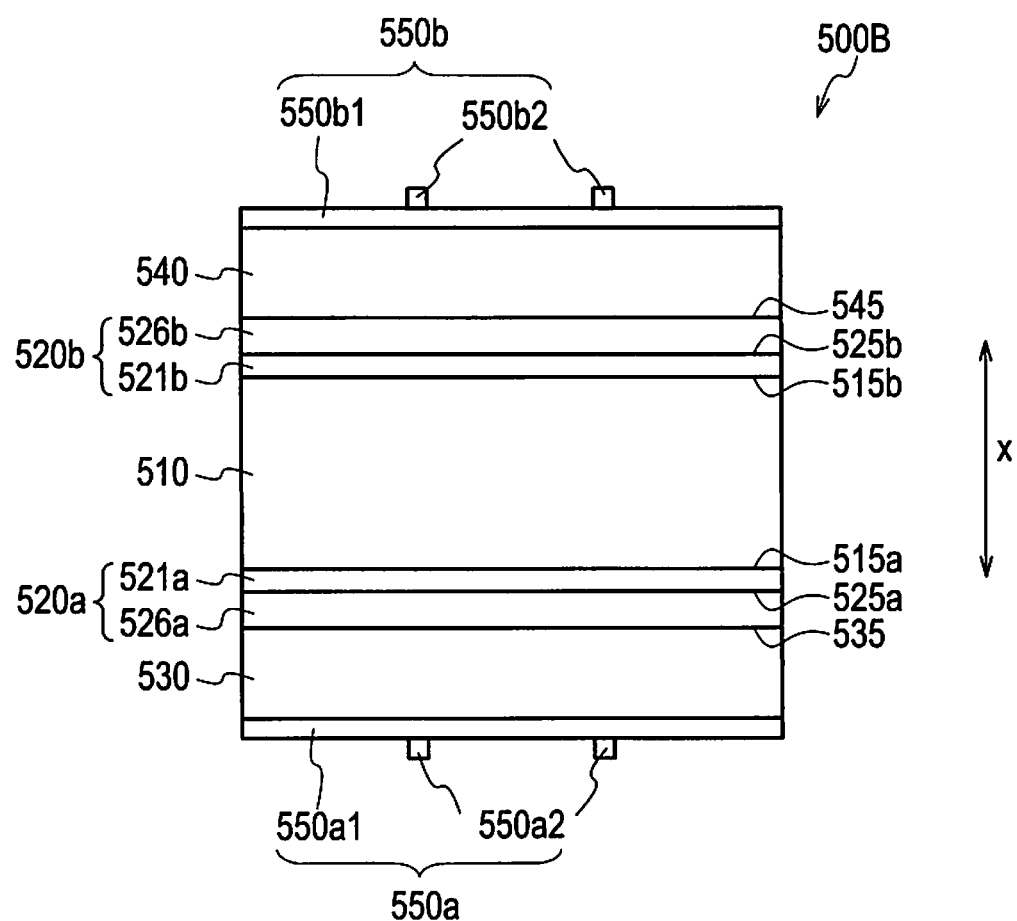
FIG. 10 is a cross section of the solar cell 500B according to the fourth embodiment of the present invention.

A method for manufacturing a solar cell 500B according to a fourth embodiment of the present invention will be described by referring to FIG. 2, FIG. 9 and FIG. 10. Hereinbelow, descriptions are omitted for parts that are the same as the method for manufacturing the solar cell 500A according to the first embodiment. In other words, descriptions will be given mainly on points different from the method for manufacturing the solar cell 500A according to the first embodiment. FIG. 9 is a flowchart for describing the method for manufacturing the solar cell 500B according to this embodiment. FIG. 10 is a cross section of the solar cell 500B according to this embodiment.

As shown in FIG. 9, the method for manufacturing the solar cell 500B according to the fourth embodiment includes step S1 to step S3. As similar to the method for manufacturing the solar cell 500A of the first embodiment, the method for manufacturing the solar cell 500B of this embodiment uses a semiconductor manufacturing equipment 1.

Step S1 is a step of respectively forming an i-type semiconductor layer 521a and an i-type semiconductor layer 521b on both principle planes of a substrate 510 by catalytic chemical vapor deposition. As similar to the method for manufacturing the solar cell 500A, the i-type semiconductor layer 521a and the i-type semiconductor layer 521b are respectively formed on both principle planes of the substrate 510 in an i-type layer forming chamber 20. What is different from the method for manufacturing the solar cell 500A is that: the i-type semiconductor layer 521a and the i-type semiconductor layer 521b can be formed thin, because an i-type semiconductor layer 526a and an i-type semiconductor layer 526b are additionally formed in later-described step S2. As for the film-thicknesses of the i-type semiconductor layer 521a and the i-type semiconductor layer 521b, it is sufficient that the layers have a certain thickness or more. Specifically, if the i-type semiconductor layer 521a and the i-type semiconductor layer 521b formed on both principle planes of the substrate 510 have this certain thickness in step S1, it is possible to prevent an impurity from entering the boundary face between the substrate and the first-conductivity type semiconductor layer 530 or the second-conductivity type semiconductor layer 540. To be concrete, the total thickness of the i-type semiconductor layer 521a and the i-type semiconductor layer 521b on the substrate 510 is 2 nm or more.

After forming the i-type semiconductor layer 521a and the i-type semiconductor layer 521b of predetermined thicknesses on both principle planes of the substrate 510, introduction of $SiH_4$ and $H_2$ is terminated. Air is exhausted from the outlet so that the amount of vacuum inside the i-type layer forming chamber 20 reaches a predetermined amount.

Step S2 is thereafter carried out. Step S2 includes step S22, step S24, step S26 and step S28.

Firstly, step S22 is carried out. Step S22 is a step of forming the i-type semiconductor layer 526a on top of the i-type semiconductor layer 521a formed on the principle plane 515a of the substrate 510.

Inside a first-conductivity type layer forming chamber 30, air is exhausted from the outlet and a predetermined amount of vacuum is held. A tray 200 is conveyed from the i-type layer forming chamber 20 to the first-conductivity type layer forming chamber 30 by a conveying system not shown.

After the tray 200 is moved to the first-conductivity type layer forming chamber 30, a catalyzer 351 and a catalyzer 352 are energized so that their temperatures are increased. $SiH_4$ and $H_2$ being reactant gases are introduced into the first-conductivity type layer forming chamber 30. The introduced reactant gases are decomposed by the catalyzers, and the i-type semiconductor layer 526a is formed on top of the i-type semiconductor layer 521a.

After forming the i-type semiconductor layer 526a on the surface of the i-type semiconductor layer 521a, introduction of $SiH_4$ and $H_2$ is terminated. Air is exhausted from the outlet so that the amount of vacuum inside the first-conductivity type layer forming chamber 30 reaches a predetermined amount.

Step S24 is thereafter carried out. Step S24 is a step of forming the first-conductivity type semiconductor layer 530 on top of the i-type semiconductor layer 526a formed on the principle plane 515a side of the substrate 510. $SiH_4$ being a reactant gas, and a doping gas are introduced into the first-conductivity type layer forming chamber 30 holding a predetermined amount of vacuum. The introduced reactant gases are decomposed by the catalyzers, and the first-conductivity type semiconductor layer 530 is formed on top of the i-type semiconductor layer 526a.

After forming the first-conductivity type semiconductor layer 530 on the surface of the i-type semiconductor layer 526a, introduction of $SiH_4$ and the doping gas is terminated. Air is exhausted from the outlet so that the amount of vacuum inside the first-conductivity type layer forming chamber 30 reaches a predetermined amount. Note that although in this method, air is exhausted after step S22 until the amount of vacuum inside the first-conductivity type layer forming chamber 30 reaches a predetermined amount, step S24 may be carried out continuously by adding the doping gas without exhausting air.

Step S26 is thereafter carried out. Step S26 is a step of forming the i-type semiconductor layer 526b on the surface of the i-type semiconductor layer 521b formed on the principle plane 515b of the substrate 510. The tray 200 is conveyed from the first-conductivity type layer forming chamber 30 to the second-conductivity type layer forming chamber 40 by a conveying system not shown. Inside the second-conductivity type layer forming chamber 40, air is exhausted from the outlet and a predetermined amount of vacuum is held. A catalyzer 451, a catalyzer 452 and a catalyzer 453 are heated so that their temperatures are increased. $SiH_4$ and $H_2$ being reactant gases are introduced into the second-conductivity type layer forming chamber 40. The introduced reactant gases are decomposed by the catalyzers, and the i-type semiconductor layer 526b is formed on the surface of the i-type semiconductor layer 521b.

After forming the i-type semiconductor layer 526b on top of the i-type semiconductor layer 521b, introduction of $SiH_4$ and $H_2$ is terminated. Air is exhausted from the outlet so that the amount of vacuum inside the second-conductivity type layer forming chamber 40 reaches a predetermined amount.

Step S28 is thereafter carried out. Step S28 is a step of forming the second-conductivity type semiconductor layer 540 on the surface of the i-type semiconductor layer 526b formed on the principle plane 515b side of the substrate 510. $SiH_4$ being a reactant gas, and a doping gas are introduced into the second-conductivity type layer forming chamber 40 holding a predetermined amount of vacuum. The introduced reactant gases are decomposed by the catalyzers, and the second-conductivity type semiconductor layer 540 is formed on the surface of the i-type semiconductor layer 526b.

After forming the second-conductivity type semiconductor layer 540 on the surface of the i-type semiconductor layer 526b, introduction of $SiH_4$ and the doping gas is terminated. Air is exhausted from the outlet so that the amount of vacuum inside the second-conductivity type layer forming chamber 40 reaches a predetermined amount. Note that although in this method, air is exhausted after step S26 until the amount of vacuum inside the second-conductivity type layer forming chamber 40 reaches a predetermined amount, step S28 may be carried out continuously by adding the doping gas without exhausting air.

Step S3 is thereafter carried out. Step S3 is the same as the above method for manufacturing the solar cell 500A according to the first embodiment. The solar cell 500B according to the fourth embodiment shown in FIG. 10 is manufactured through these processes. In the manufacturing method according to the fourth embodiment, the i-type semiconductor layer 521a and the i-type semiconductor layer 521b are formed on the substrate 510 before the first-conductivity type semiconductor layer 530 and the second-conductivity type semiconductor layer 540 are formed. Accordingly, it is possible to inhibit the impurity to be doped into the first-conductivity type semiconductor layer 530 or the second-conductivity type semiconductor layer 540 from entering the boundary face 515a between the substrate 510 and the i-type semiconductor layer 521a, as well as the boundary face 515b between the substrate 510 and the i-type semiconductor layer 521b. Hence, the boundary face between the substrate 510 and the i-type semiconductor layer 521a, as well as the boundary face between the substrate 510 and the i-type semiconductor layer 521b can be kept clean. Degradation of interfacial quality can thus be curbed, so that a solar cell of high photoelectric conversion efficiency can be manufactured.

In addition, the i-type semiconductor layer 526b is formed in the same forming chamber (second-conductivity type layer forming chamber 40) as is the second-conductivity type semiconductor layer 540, and is therefore affected by the doping gas left in the second-conductivity type layer forming chamber 40. Accordingly, regarding a direction x perpendicular to the principle plane 515b as an axis, a peak of the amount of dopant included in the i-type semiconductor layer 520b within a range from the boundary face 515b between the substrate 510 and the i-type semiconductor layer 521b to the boundary face 545 between the i-type semiconductor layer 526b and the second-conductivity type semiconductor layer 540 exists in the i-type semiconductor layer 520b including the i-type semiconductor layer 521b and the i-type semiconductor layer 526b. To be specific, the peak of the dopant amount is around the boundary face 525b between the i-type semiconductor layer 521b and the i-type semiconductor layer 526b. However, the impurity amount in the i-type semiconductor layer 521b is small. In particular, the dopant amount in the boundary face 515b between the substrate 510 and the i-type semiconductor layer 521b is extremely small. For this reason, the solar cell 500B exerts high conversion efficiency.

Moreover, each of the i-type semiconductor layer 520a and the i-type semiconductor layer 520b has a two-layer configuration in this embodiment. Only the i-type semiconductor layer 521a and the i-type semiconductor layer 521b, which are the first layers, are formed in the i-type layer forming chamber 20. This can shorten the time for forming the i-type semiconductor layer in the i-type layer forming chamber 20 as compared to the first embodiment. As a result, it is no longer necessary to widen the intervals between the substrates 510 and the catalyzers, or to add a mechanism for cooling the substrate 510 in the i-type layer forming chamber 20. Thus, the manufacturing equipment can be made simpler than in the first embodiment.

Additionally, in this embodiment, the i-type semiconductor layer 526a and the i-type semiconductor layer 526b are respectively formed in the first-conductivity type layer forming chamber 30 and the second-conductivity type layer forming chamber 40. This makes it possible to separately control quality and thickness of film for the i-type semiconductor layer 526a and for the i-type semiconductor layer 526b. An optimal quality and thickness of film can thus be achieved for the i-type semiconductor layer 526b, whereby a solar cell of high conversion efficiency can be manufactured.

(5) Other Embodiments

Although contents of the present invention have been described according to the foregoing embodiments of the invention, it should not be understood that descriptions and drawings constituting part of this disclosure limit the present invention.

For example, although the catalyzers disposed in the i-type layer forming chamber 20 are energized simultaneously in the embodiments of the invention, this is not necessarily the case. For example, timings and energizing time periods may be appropriately varied among the catalyzers such as: not energizing a group of the catalyzer 252 and the catalyzer 254 while energizing a group of the catalyzer 251, the catalyzer 253 and the catalyzer 255; or alternately energizing the group consisting of the catalyzer 251, the catalyzer 253 and the catalyzer 255 and the group consisting of the catalyzer 252 and the catalyzer 254. This makes it possible to prevent excessive heating and form a semiconductor layer of excellent quality.

Although in the method for manufacturing the solar cell 500A according to the second embodiment the i-type layer forming chamber 20A is partitioned into the i-type layer forming chamber 21 and the i-type layer forming chamber 22 by an openable and closeable partition wall 23, this is not necessarily the case. The i-type layer forming chamber 21 and the i-type layer forming chamber 22 may otherwise be a single chamber. Moreover, the positional relationship between the catalyzers disposed in the i-type layer forming chamber 21 and the catalyzers disposed in the i-type layer forming chamber 22 may be reversed.

Although in the method for manufacturing the solar cell 500A according to the third embodiment the transport fork 75 only carried a single substrate 510, this is not necessarily the case. The transport fork 75 may carry a plurality of substrates 510. For example, left and right transport forks each carrying two substrates 510 in tandem may be installed, so that four substrates 510 can be carried simultaneously. Moreover, two i-type layer forming chambers 20B may be provided as similar to the aforementioned second embodiment. Note that in this case, the shape of the conveying chamber 70B may be a polygon not less than a pentagon, instead of the square shape shown in FIG. 7.

Although in the method for manufacturing the solar cell 500B according to the fourth embodiment the i-type semiconductor layer 521a and the i-type semiconductor layer 521b are simultaneously formed on the substrate 510 in step S1, this is not necessarily the case. As in the manufacturing method for the solar cell 500A, step S1 may include step S12 and step S14. Specifically, the i-type semiconductor layer 520a may be formed on the principle plane 515a of the substrate 510 after forming the i-type semiconductor layer 520b on the principle plane 515b of the substrate 510.

Moreover, the first to fourth embodiments describe manufacturing methods for the solar cell 500 including: the i-type semiconductor layer 520a and the first-conductivity type semiconductor layer 530 formed on one principle plane 515a of the substrate 510; and the i-type semiconductor layer 520b and the second-conductivity type semiconductor layer 540 formed on the other principle plane 515b opposite to the one principle plane. However, the present invention is not limited to these methods. For example, the present invention may be applied to a manufacturing method for a back contact type solar cell. The i-type semiconductor layers are respectively formed on both the principle planes 515 of the substrate 510. Then, the first-conductivity type semiconductor layer is formed in a first region on the one principle plane 515a side of the substrate 510 made of a semiconductor material. Meanwhile, the second-conductivity type semiconductor layer is formed in a second region on the principle plane 515a. The second region is a region different from the first region. For example, each of the first region and the second region may be of a comb shape, where teeth corresponding to the first region and teeth corresponding to the second region are arranged alternately. When forming the first-conductivity type semiconductor layer and the second-conductivity type semiconductor layer, a region for one of the semiconductor layers is covered by a covering member. Additionally, a reflection preventing layer is formed on the other principle plane 515b side opposite to the one principle plane. Hence, the present invention can also be applied to a manufacturing method for a back contact type solar cell in which the other principle plane 515b side is used as a light incident side. Note that the reflection preventing layer may be formed before the first-conductivity type semiconductor layer and the second-conductivity type semiconductor layer are formed. In addition, although in the above example one region is covered by a covering member when the first-conductivity type semiconductor layer and the second-conductivity type semiconductor layer are formed, this is not necessarily the case. For example, firstly, the first-conductivity type semiconductor layer is formed on almost the entire surface of the one principle plane. Subsequently, a portion of the first-conductivity type semiconductor layer corresponding to the second region is removed by etching or the like. Then, the second-conductivity type semiconductor layer may be formed in the portion from which the first-conductivity type semiconductor layer is removed. Otherwise, a third-conductivity type semiconductor layer of the same conductivity type as the substrate 510 may be formed between the reflection preventing layer and the i-type semiconductor layer. In this case, since the third-conductivity type semiconductor layer is of the same conductivity type as either the first-conductivity type semiconductor layer or the second-conductivity type semiconductor layer, semiconductor layers of the same conductivity type as the substrate 510 may be simultaneously formed on both principle planes of the substrate 510.

Additionally, although in the present invention the i-type semiconductor layer, the first-conductivity type semiconductor layer and the second-conductivity type semiconductor layer can be formed of various semiconductor materials, a solar cell of excellent photoelectric conversion characteristics can be manufactured by using an amorphous semiconductor layer containing hydrogen, particularly a hydrogenated amorphous silicon layer, to form the layers.

Note that adhesion of a semiconductor film on a tray generally makes it difficult to maintain the overall electric potential of the tray at zero. For this reason, quality and thickness of the semiconductor film may become uneven in plasma CVD. The above-mentioned embodiments use catalytic chemical vapor deposition. Thus, unlike plasma CVD, electric fields need not be generated between the substrate and the catalyzers. Accordingly, the electric potential of the substrate need not be set to zero (ground potential). As a result, an even semiconductor film can be formed on all of the substrates set in the tray.

As described above, the present invention includes various embodiments which are not described herein.

Accordingly, the technical scope of the present invention should be determined only by the matters to define the invention in the scope of claims regarded as appropriate based on the description.

Note that the entire content of Japanese Patent Application No. 2010-83217 (filed on Mar. 31, 2010) is incorporated herein by reference.

Industrial Applicability

As has been described, the solar cell and the method for manufacturing a solar cell according to the present invention is capable of inhibiting the dopant from entering the boundary face between the substrate and the i-type semiconductor layer when the i-type semiconductor layer is formed on both principle planes of the substrate. Since conversion efficiency is thus improved, the manufacturing method is useful in the field of solar-cell manufacturing.

The invention claimed is:

1. A method for manufacturing a solar cell including: a substrate made of a crystalline semiconductor and having a first principle plane and a second principle plane, an intrinsic semiconductor layer made of an amorphous semiconductor, and a first semiconductor layer and a second semiconductor layer each made of an amorphous semiconductor, in which one of the first semiconductor layer and the second semiconductor layer is of the same conductivity type as the substrate, and the other is of the conductivity type opposite from the substrate, the method comprising:

step S1 of forming the intrinsic semiconductor layer on each of the first principle plane and the second principle plane of the substrate by catalytic chemical vapor deposition; and step S2 of forming any one of the first semiconductor layer and the second semiconductor layer on at least one of the intrinsic semiconductor layers respectively formed on both the principle planes of the substrate, wherein in the step S1, catalyzers that decompose raw gas when being heated by receiving an electric current include a first catalyzer and a second catalyzer, and the first catalyzer is disposed at a position facing the first principle plane in the step S1, and the second catalyzer is disposed at a position facing the second principle plane in the step S1, and wherein:

a plurality of the first catalyzers is arranged at first intervals, and a plurality of the second catalyzers is arranged at second intervals;

the step S1 includes step A of forming the intrinsic semiconductor layer on the first principle plane and step B of forming the intrinsic semiconductor layer on the second principle plane;

in the step A, a first substrate is conveyed to a position located in one of the first intervals and facing the first catalyzer, so that the intrinsic semiconductor layer is formed on the first principle plane of the first substrate, and a second substrate is conveyed to a position located in an adjacent one of the first intervals and facing the first catalyzer which the first substrate faces, so that the intrinsic semiconductor layer is formed on the first principle plane of the second substrate; and in the step B, the first substrate is conveyed to a position located between one second catalyzer and another second catalyzer adjacent to the one second catalyzer, and facing the one second catalyzer, so that the intrinsic semiconductor layer is formed on the second principle plane of the first substrate, and the second substrate is conveyed to a position located between the one second catalyzer and the other second catalyzer, and facing the other second catalyzer, so that the intrinsic semiconductor layer is formed on the second principle plane of the second substrate.

2. The method for manufacturing a solar cell according to claim 1, wherein the step S2 includes a first semiconductor layer-forming step and a second semiconductor layer-forming step, in the first semiconductor layer-forming step, the first semiconductor layer is formed on top of the intrinsic semiconductor layer formed on the first principle plane of the substrate, and in the second semiconductor layer-forming step, the second semiconductor layer is formed on top of the intrinsic semiconductor layer formed on the second principle plane of the substrate.

3. The method for manufacturing a solar cell according to claim 1, wherein
the step S2 includes a first semiconductor layer-forming step and a second semiconductor layer-forming step,
in the first semiconductor layer-forming step, the first semiconductor layer is formed on a place including a first region in the intrinsic semiconductor layer formed on the first principle plane of the substrate, and
in the second semiconductor layer-forming step, the second semiconductor layer is formed on a place including a second region in the intrinsic semiconductor layer formed on the first principle plane of the substrate.

4. The method for manufacturing a solar cell according to claim 2, wherein
the first semiconductor layer-forming step and the second semiconductor layer-forming step each include a step of forming a second intrinsic semiconductor layer made of an amorphous semiconductor,
in the first semiconductor layer-forming step, the second intrinsic semiconductor layer and the first semiconductor layer are formed in this order on the intrinsic semiconductor layer, and
in the second semiconductor layer-forming step, the second intrinsic semiconductor layer and the second semiconductor layer are formed in this order on the intrinsic semiconductor layer.

5. The method for manufacturing a solar cell according to claim 4, wherein the second intrinsic semiconductor layer and at least any one semiconductor layer of the first semiconductor layer and the second semiconductor layer are formed in the same forming chamber.

6. The method for manufacturing a solar cell according to claim 4, wherein a peak of an amount of a dopant, which is to be doped into the first semiconductor layer, within a range from a boundary face between the substrate and the intrinsic semiconductor layer to a boundary face between the second intrinsic semiconductor layer and the first semiconductor layer exists in a layer including the intrinsic semiconductor layer and the second intrinsic semiconductor layer.

7. The method for manufacturing a solar cell according to claim 4, wherein a thickness of the intrinsic semiconductor layer on the substrate is 2 nm or more.

8. The method for manufacturing a solar cell according to claim 1, wherein
the first catalyzer faces the first principle plane of a first substrate and the first principle plane of a second substrate different from the first substrate, and
the intrinsic semiconductor layers are simultaneously formed on the first principle plane of the first substrate and the first principle plane of the second substrate.

9. The method for manufacturing a solar cell according to claim 1, wherein
a plurality of the first catalyzers and the second catalyzers is alternately disposed at predetermined intervals, and substrate is placed at the intervals so that the intrinsic semiconductor layers are formed respectively on both of the first principle plane and the second principle plane of the substrate.

10. The method for manufacturing a solar cell according to claim 1, wherein in the step S1, the first catalyzers and the second catalyzers are alternately heated by receiving an electric current.

11. The method for manufacturing a solar cell according to claim 1, wherein the substrate is conveyed to be subjected to the step S1 and the step S2, and
only the substrate is conveyed at the time of conveyance.

12. A method for manufacturing a solar cell including: a substrate made of a crystalline semiconductor and having a first principle plane and a second principle plane, an intrinsic semiconductor layer made of an amorphous semiconductor, and a first semiconductor layer and a second semiconductor layer each made of an amorphous semiconductor, in which
one of the first semiconductor layer and the second semiconductor layer is of the same conductivity type as the substrate, and the other is of the conductivity type opposite from the substrate, the method comprising:
step S1 of forming the intrinsic semiconductor layer on each of the first principle plane and the second principle plane of the substrate by catalytic chemical vapor deposition; and
step S2 of forming any one of the first semiconductor layer and the second semiconductor layer on at least one of the intrinsic semiconductor layers respectively formed on both the principle planes of the substrate, wherein
in the step S1,
catalyzers that decompose raw gas when being heated by receiving an electric current include a first catalyzer and a second catalyzer, and
the first catalyzer is disposed at a position facing the first principle plane in the step S1, and the second catalyzer is disposed at a position facing the second principle plane in the step S1,
wherein
the step S2 includes a first semiconductor layer-forming step and a second semiconductor layer-forming step,
in the first semiconductor layer-forming step, the first semiconductor layer is formed on top of the intrinsic semiconductor layer formed on the first principle plane of the substrate, and
in the second semiconductor layer-forming step, the second semiconductor layer is formed on top of the intrinsic semiconductor layer formed on the second principle plane of the substrate, and
wherein
the first semiconductor layer-forming step and the second semiconductor layer-forming step each include a step of forming a second intrinsic semiconductor layer made of an amorphous semiconductor,
in the first semiconductor layer-forming step, the second intrinsic semiconductor layer and the first semiconductor layer are formed in this order on the intrinsic semiconductor layer, and
in the second semiconductor layer-forming step, the second intrinsic semiconductor layer and the second semiconductor layer are formed in this order on the intrinsic semiconductor layer.

13. A method for manufacturing a solar cell including: a substrate made of a crystalline semiconductor and having a first principle plane and a second principle plane, an intrinsic semiconductor layer made of an amorphous semiconductor, and a first semiconductor layer and a second semiconductor layer each made of an amorphous semiconductor, in which
one of the first semiconductor layer and the second semiconductor layer is of the same conductivity type as the substrate, and the other is of the conductivity type opposite from the substrate, the method comprising:
step S1 of forming the intrinsic semiconductor layer on each of the first principle plane and the second principle plane of the substrate by catalytic chemical vapor deposition; and
step S2 of forming any one of the first semiconductor layer and the second semiconductor layer on at least one of the intrinsic semiconductor layers respectively formed on both the principle planes of the substrate, wherein
in the step S1,
catalyzers that decompose raw gas when being heated by receiving an electric current include a first catalyzer and a second catalyzer, and
the first catalyzer is disposed at a position facing the first principle plane in the step S1, and the second catalyzer is disposed at a position facing the second principle plane in the step S1, wherein
the step S2 includes a first semiconductor layer-forming step and a second semiconductor layer-forming step,
in the first semiconductor layer-forming step, the first semiconductor layer is formed on a place including a first region in the intrinsic semiconductor layer formed on the first principle plane of the substrate, and
in the second semiconductor layer-forming step, the second semiconductor layer is formed on a place including a second region in the intrinsic semiconductor layer formed on the first principle plane of the substrate and, wherein the first semiconductor layer-forming step and the second semiconductor layer-forming step each include a step of forming a second intrinsic semiconductor layer made of an amorphous semiconductor, in the first semiconductor layer-forming step, the second intrinsic semiconductor layer and the first semiconductor layer are formed in this order on the intrinsic semiconductor layer, and in the second semiconductor layer-forming step, the second intrinsic semiconductor layer and the second semiconductor layer are formed in this order on the intrinsic semiconductor layer.

* * * * *